United States Patent [19]

Lafon

[11] Patent Number: 5,268,652
[45] Date of Patent: Dec. 7, 1993

[54] CIRCUIT FOR DETECTING LOCKING OF A DIGITAL PHASE LOCKED LOOP

[75] Inventor: Jean-Luc Lafon, Le Perreux sur Marne, France

[73] Assignee: Alcatel CIT, Paris, France

[21] Appl. No.: 955,260

[22] Filed: Oct. 1, 1992

[30] Foreign Application Priority Data

Oct. 4, 1991 [FR] France .................. 91 12267

[51] Int. Cl.$^5$ ............................ H03L 7/095
[52] U.S. Cl. ............................ 331/1 A; 328/155; 331/25; 331/DIG. 2
[58] Field of Search ............ 331/1 A, 25, DIG. 2; 328/155

[56] References Cited

U.S. PATENT DOCUMENTS 4,806,878 2/1989 Cowley .................. 331/1 A

FOREIGN PATENT DOCUMENTS

| 0349966 | 1/1990 | European Pat. Off. . |
| 0433120 | 6/1991 | European Pat. Off. . |
| WO81/02497 | 9/1981 | Int'l Pat. Institute . |
| WO87/01885 | 3/1987 | Int'l Pat. Institute . |

Primary Examiner—Siegfried H. Grimm
Attorney, Agent, or Firm—Sughrue, Mion, Zinn, Macpeak & Seas

[57] ABSTRACT

A circuit for detecting locking of a digital phase locked loop for locking the phase of a digital outgoing signal as provided by the loop to the phase of a digital incoming signal received by the loop, wherein the phase locked loop includes a detector for detecting the phase difference between the incoming signal and the outgoing signal, and the output signal from the phase difference detector has transitions of a first type in coincidence with transitions of a given type in the outgoing signal, and transitions of a second type in coincidence with transitions of a given type in the incoming signal, the circuit including locking detection means for detecting locking, the locking detection means themselves including means for sampling the output signal from the phase detector by those transitions in the outgoing signal that are of type opposite to the given type, means for storing groups of consecutive samples, comprising not less than three consecutive samples, and means for detecting the instant at which, for the first time, at least two of the samples are not at the same logic level.

1 Claim, 4 Drawing Sheets

CIRCUIT FOR DETECTING LOCKING OF A DIGITAL PHASE LOCKED LOOP

The present invention relates to treating digital signals. More particularly, it relates to circuits known as digital phase locked loops.

BACKGROUND OF THE INVENTION

Such circuits are well known. It is merely recalled that they are used for locking the phase of a digital "outgoing" signal as provided by said loop to the phase of a digital "incoming" signal received by said loop, and that they operate essentially by incrementing or decrementing the frequency of a clock signal provided by an oscillator internal to said loop, as a function of the phase difference that exists between said incoming and outgoing signals. The signal for controlling incrementing or decrementing the frequency of the clock signal delivered by said oscillator is itself delivered by the "overflow" output of a counter which is triggered by a signal representative of said phase difference, and which counts at the rate of a clock signal that is also delivered by said internal oscillator.

The invention applies particularly to synchronizing a telecommunications terminal that is connected to a telecommunications network operating in asynchronous transfer mode, via an "adaptor" circuit enabling a synchronous interface to be reconstituted relative to said terminal, such an adaptor circuit making use of a digital phase locked loop to generate a clock signal whose mean frequency is equal to the base frequency of said synchronous interface, and whose phase is servo-controlled to the phase of an incoming clock signal at a rate equal to the rate of the data received from said network by said adaptor circuit.

When a call is established involving said terminal, such an application requires simultaneously both a relatively short locking time for said loop and a relatively long filtering time to satisfy the conditions laid down by the standards governing such an interface concerning the maximum jitter acceptable for said clock signal whose mean frequency is equal to the base frequency of said synchronous interface. Such conditions are generally strict.

For such an application in which the input signal for said loop is present intermittently, with arbitrary phase state from one occasion to another, it may be necessary to use a method in which the operating mode of such a loop is controlled to pass through the following steps in order:

detecting the beginning of the presence of said input signal;

selecting a counting range for said counter that is relatively small in value in order to enable said loop to lock relatively quickly;

detecting that said loop has locked; and selecting a count range for said counter having a relatively large value in order to provide a relatively high degree of filtering on possible phase variations in said input signal that may occur while it is present, with this last setting being retained until the next time a beginning of the presence of said input signal is detected.

An object of the present invention is to provide a circuit enabling such locking to be detected.

SUMMARY OF THE INVENTION

The present invention provides a circuit for detecting locking of a digital phase locked loop, wherein said phase locked loop includes a detector for detecting the phase difference between said incoming signal and said outgoing signal, and the output signal from said phase difference detector has transitions of a first type in coincidence with transitions of a given type in the outgoing signal, and transitions of a second type in coincidence with transitions of a given type in the incoming signal, said circuit including locking detection means for detecting locking, said means themselves including means for sampling the output signal from the phase detector by those transitions in the outgoing signal that are of type opposite to said given type, means for storing groups of consecutive samples, comprising not less than three consecutive samples, and means for detecting the instant at which, for the first time, at least two of said samples are not at the same logic level.

BRIEF DESCRIPTION OF THE DRAWINGS

An embodiment of the invention is described by way of example with reference to the accompanying drawings, in which.

DETAILED DESCRIPTION

Figure 1:
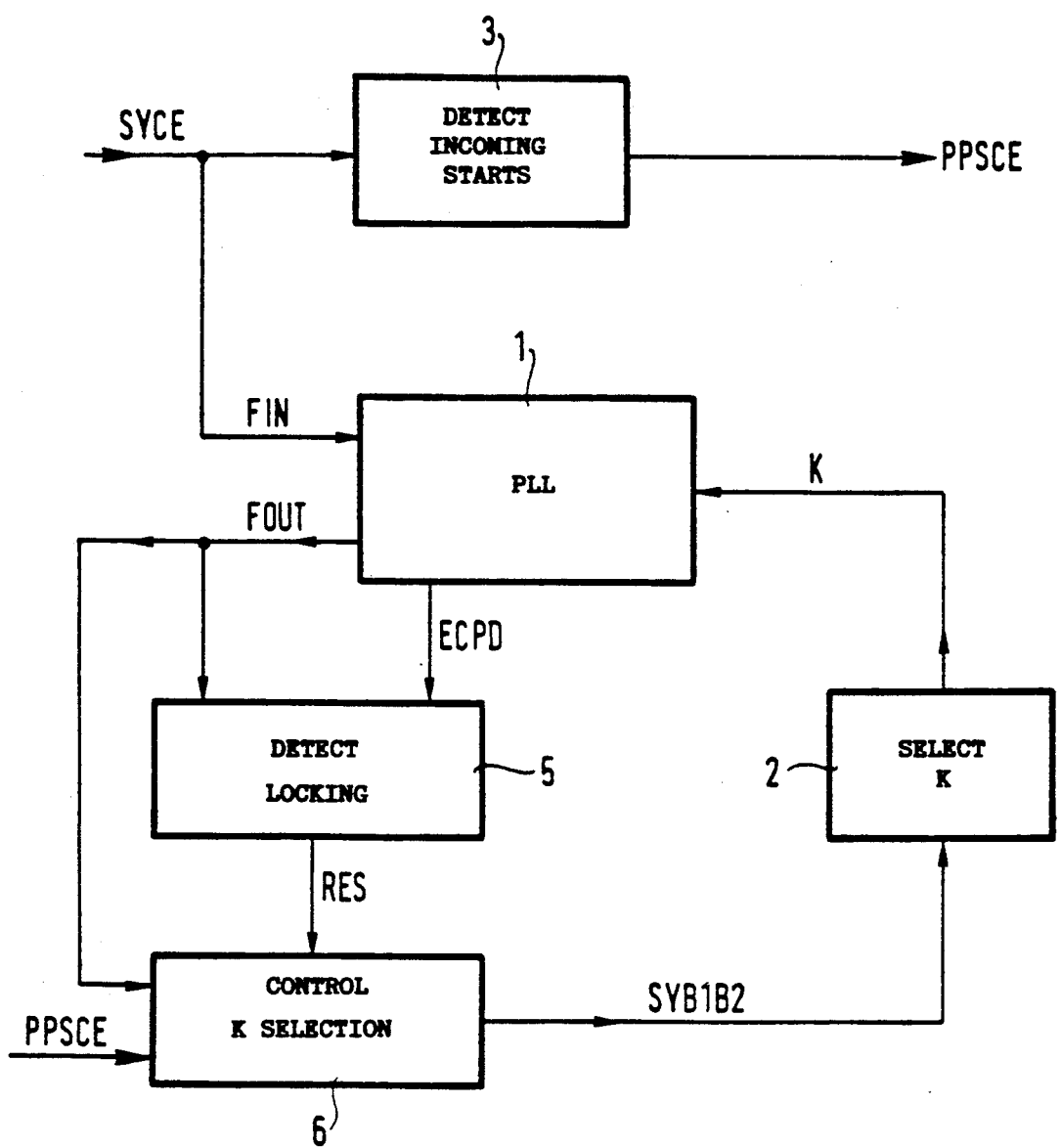
FIG. 1 is a block diagram showing the application of a circuit of the invention for controlling the mode of operation of a digital phase locked loop, as defined above.

In FIG. 1, reference 1 designates a digital phase locked loop which may be of order 1, for example. This phase locked loop (whose internal structure is not shown in this figure) receives an "incoming" signal referenced FIN, and it delivers an "outgoing" signal referenced FOUT. Via coefficient selection means 2, this loop also receives a coefficient K for controlling the count range of its incrementation or decrementation control counter, and it also provides an output signal ECPD from its phase detector.

In the present case, the phase detector is a detector controlled by the transitions in the signals that are applied thereto, and it is assumed below, by way of example, that a falling transition in the signal FOUT causes said signal ECPD to switch to a high level, and that a following falling transition in the signal FIN causes the said signal ECPD to switch to a low level.

In FIG. 1, reference 3 designates means for detecting the beginning of the presence of the incoming signal. In the application outlined above, of synchronizing a telecommunications terminal connected to a telecommunications network using asynchronous mode transfer, the incoming signal, when present, is in the form of a sequence of cells or packets of fixed length, with the cells in the same sequence all relating to the same call set up via such a network. The sequences of cells obtained in this way are thus presented intermittently, as and when calls involving the terminal in question appear and disappear.

The detection means 3 receives a digital signal referenced SYCE whose rate is constituted by the cell arrival rate, said signal constituting the input signal FIN of the phase locked loop.

In FIG. 1, reference 5 designates means for detecting locking of the phase locked loop 1, which means operate on the basis of the signals ECPD and FOUT in a manner described below with reference to FIG. 2. FIG. 1 also shows control means 6 for controlling the coefficient selection means 2 in response to the signal RES delivered by the means 5, to the signal FOUT, and to a signal PPSCE, in a manner described below with reference to FIG. 2, the means 6 delivering a signal referenced SYB1B2 for controlling said coefficient selection means 2.

Figure 2:
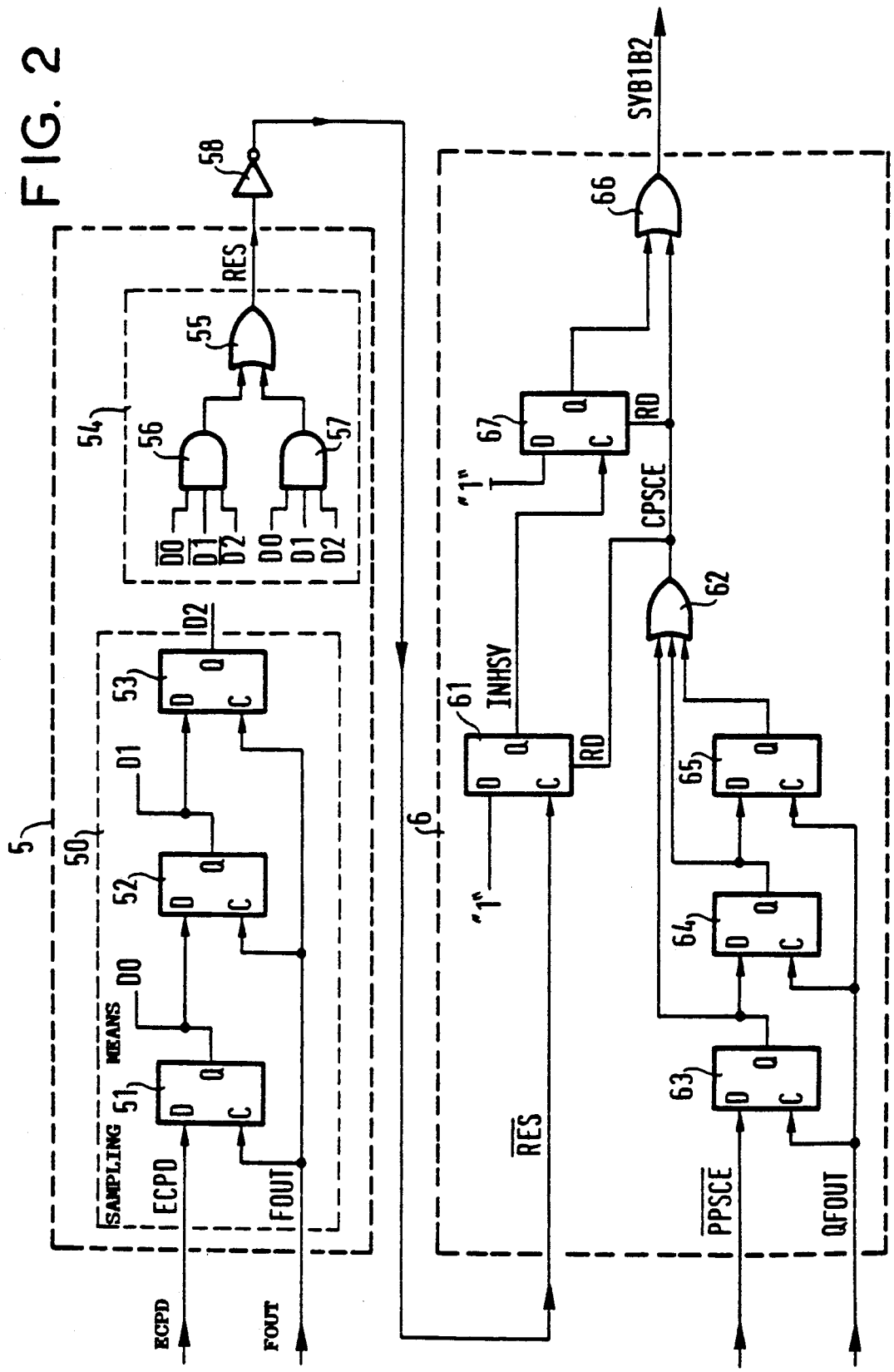
FIG. 2 is a circuit diagram of one possible implementation of the means of the invention for detecting locking of the phase locked loop, and control means for selecting the count range as used in said control circuit.

The locking detection means 5 as shown in FIG. 2 comprise sampling means 50 for sampling the signal ECPD by means of the signal FOUT and for storing a certain number (in this case three but the number could be greater) of consecutive samples obtained in this way.

The means 50 in this case comprise three D-type bistables 51, 52, and 53 all having their clock inputs C receiving the signal FOUT, the D input of bistable 51 receiving the signal ECPD, the D input of bistable 52 receiving the signal D0 delivered by the Q output of the bistable 51, and the D input of the bistable 53 receiving the signal D1 delivered by the Q output of the bistable 52, with the signal delivered by the Q output of the bistable 53 being referenced D2.

The locking detection means 5 also include a circuit 54 for detecting non-identical values in two of the samples stored in the means 50.

In this case, the circuit 54 comprises an OR gate 55 having a first input that receives the output signal from an AND gate 56 that receives the inverses of the signals D0, D1, and D2, written D0, D1, and D2, and having a second input that receives the output signal from an AND gate 57 receiving the signals D0, D1, and D2 directly.

The output signal from the OR gate 55 constitutes the output signal RES from the locking detection means.

The invention makes use of the property possessed by the output signal ECPD from a phase detector controlled by the transitions in the signals applied thereto whereby two such samples have opposite levels when they are obtained on opposite sides of an "ideal" locking instant that is not obtainable in practice because the loop operates by frequency increments or decrements, i.e. by varying said frequency discontinuously rather than continuously.

The locking instant as detected by the means 50 is then obtained when, for the first time, two of the three samples stored in this way are of opposite levels.

In practice, since the signal ECPD satisfies such a property relatively frequently once locking has been acquired, and relatively infrequently before such locking is acquired, the signal RES is not used directly by the coefficient selection means 2 of FIG. 1, but only after it has been processed in a circuit in the manner now described.

A signal referenced INHSY is initially generated by means of a D-type bistable 61 whose D input receives a logic level 1 and whose clock input receives a signal referenced RES obtained by inverting the signal RES by means of an inverter 58.

The bistable 61 also receives a signal referenced CPSCE on its reset to zero input RD, the signal CPSCE being generated as follows.

The signal CPSCE is obtained at the output of an OR gate 62 having three inputs respectively connected to the three Q outputs of three bistables 63, 64, and 65 connected in cascade, i.e. with the Q output of the first bistable 63 being connected to the D input of the second bistable 64, and the Q output of said second bistable being connected to the D input of the third bistable 65.

The D input of the first bistable 63 also receives the inverse of the signal PPSCE, written PPSCE, and the clock inputs of all three bistables receive a signal QFOUT at a frequency equal to one-fourth the frequency of the signal FOUT.

Starting from the first change of state in the signal RES, corresponding to locking, the signal INHSY thus makes it possible to take account of only those changes of state in said signal that occur for the first time after a certain length of time has elapsed since the beginning of the presence of said input signal was detected, which time lapse corresponds in the present case to four periods of the signal FOUT.

The coefficient selection control signal SYB1B2 is obtained at the output of an OR gate 66 provided with two inputs respectively receiving the signal CPSCE and the signal provided by the Q output of a D-type bistable 67 whose D input receives a logic level 1 and whose clock input receives the signal INHSY, and whose reset to zero input receives the signal CPSCE.

Thus, when the circuit is situated between the beginning of the presence of the input signal being detected and locking being detected, the signal SYB1B2 has a first logic level leading to a first value of the coefficient being selected that corresponds to a relatively small count range so as to reduce the locking time, and after locking has been detected, or in the absence of the input signal FIN, the signal SYB1B2 has a second logic level that causes a second value of the coefficient to be selected corresponding to a relatively large count range so as to be effective in filtering phase variations in the input signal FIN.

Figure 4:
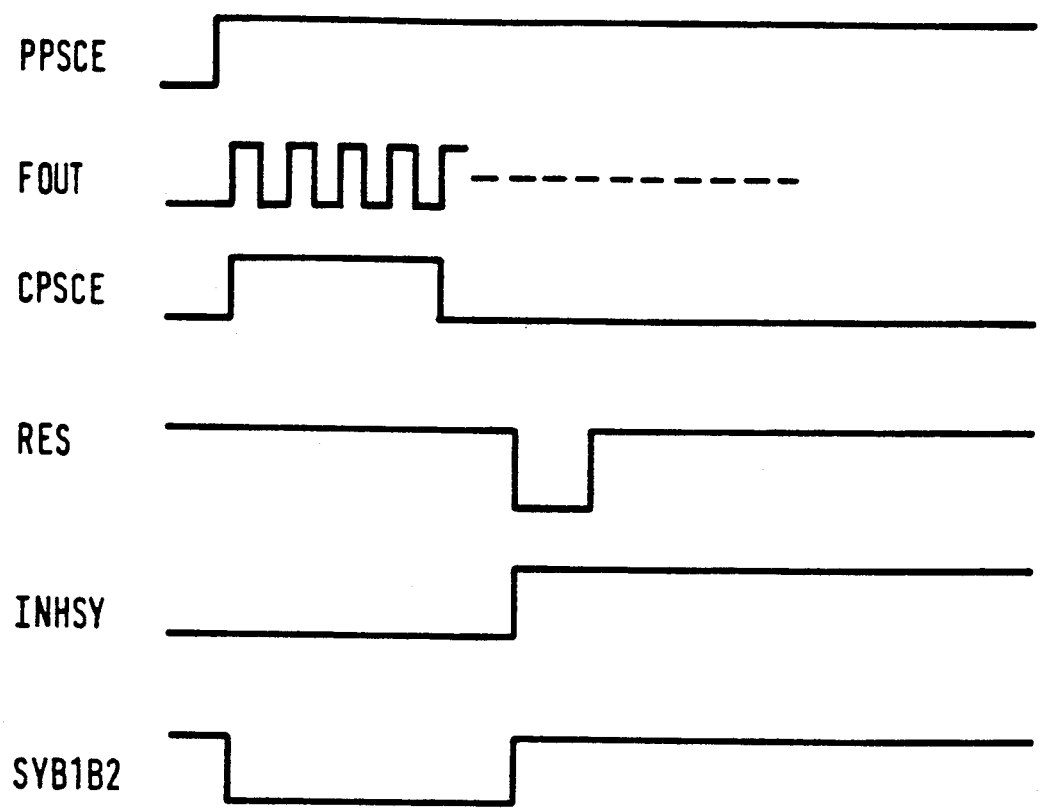
FIG. 4 is a waveform diagram for explaining said control for selecting the count range.

FIG. 4 is a waveform diagram for showing how the count range is selected in this way. The first line of this diagram shows the signal PPSCE whose changeover from logic level 0 to logic level 1 indicates that the beginning of the presence of an input signal has been detected.

The second line of the diagram represents the signal FOUT.

The third line of the diagram represents the signal CPSCE which takes up a logic level 1 on the first transition in the signal FOUT that occurs after the transition in the signal PPSCE, and in this example it retains said logic level 1 during four consecutive periods of the signal FOUT.

The fourth line of the diagram shows the signal RES which has a falling transition corresponding to locking of the phase locked loop. This falling transition is followed, in practice, by a rising transition as can be seen in the diagram.

The fifth line of the diagram shows the signal INHSY which switches from logic level 0 to logic level 1 on said falling transition in the signal RES and which subsequently retains said logic level 1 so long as the signal CPSCE remains at logic level 0.

The last line of the diagram shows the signal SYB1B2 for controlling coefficient selection, which signal satisfies the following truth table:

| CPSCE | INHSY | SYB1B2 |
|-------|-------|--------|
| 1     | 0     | 1      |
| 0     | 0     | 0      |
| 0     | 1     | 1      |

Figure 3:
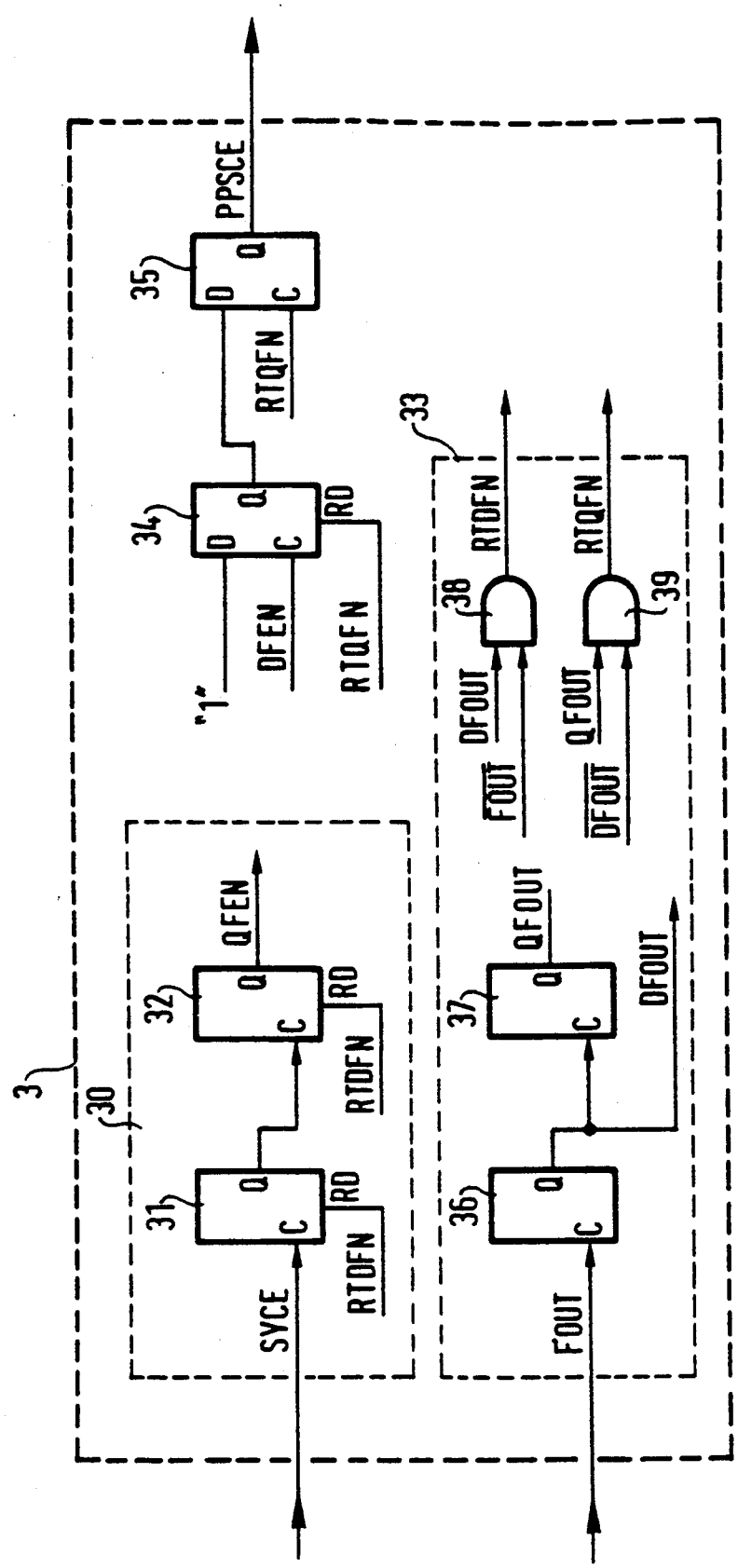
FIG. 3 is a circuit diagram of one possible embodiment of means for detecting the beginning of the presence of the incoming signal, as used in the control circuit.

The means 3 for detecting the beginning of the input signal being present, as shown in FIG. 3, operate essentially by dividing the rate of the incident signal SYCE by "n" so as to count "n" successive incident cells, and by taking account of the result of said counting at a derived rate, and in the present case at the rate of the outgoing signal FOUT as obtained by dividing the rate of said signal FOUT by the same value "n".

In the example shown in FIG. 3, the number "n" has been chosen to be equal to four. These detection means thus comprise a divide-by-n counter 30 comprising two bistables 31 and 32 connected in cascade, i.e. the Q output of the first bistable 31 is connected to the clock input of the second bistable 32. The clock input of the bistable 31 also receives the incident rate signal SYCE, and the output signal from the bistable 32 is referenced QFEN. These two bistables 31 and 32 are reset to zero respectively by a signal RTDFN and by a signal RTQFN generated by a clock signal generator 33 and derived from the signal FOUT.

The signal QFEN from the counter 30 is applied to the clock input of a D-type bistable 34 whose D input is connected to logic level 1.

The Q output of bistable 34 is connected to the D input of a bistable 35 whose clock input receives a signal RTQFN delivered by the generator 33. The Q output of the bistable 35 provides the signal PPSCE indicating the beginning of the presence of the input signal.

The bistable 34 also receives the signal RTQFN on its reset to zero input, as delivered by the generator 33.

In this example, the generator 33 comprises a divide-by-four frequency divider comprising two bistables 36 and 37 connected in cascade in a manner analogous to the bistables 31 and 32. The bistable 36 also receives the signal FOUT on its clock input and on its output Q it delivers a signal referenced DFOUT, while the bistable 37 provides a signal written QFOUT on its Q output.

The generator 33 also includes an AND gate 38 which receives the signal DFOUT and the inverse of the signal FOUT, written $\overline{FOUT}$, and which delivers the signal RTDFN.

The generator 33 also includes an AND gate 39 which receives the signal QFOUT and the inverted signal DFOUT, written $\overline{DFOUT}$, and which delivers the signal RTQFN.

Although the above description of the present invention is given by way of example with particular reference to its application to controlling the operating mode of a digital phase locked loop, as defined above, it will be understood that the present invention is not limited to this particular application and that it may have numerous applications in practice.

I claim:

1. A circuit for detecting locking of a digital phase locked loop for locking the phase of a digital outgoing signal as provided by said loop to the phase of a digital incoming signal received by said loop, wherein said phase locked loop includes a detector for detecting the phase difference between said incoming signal and said outgoing signal, and the output signal from said phase difference detector has transitions of a first type in coincidence with transitions of a given type in the outgoing signal, and transitions of a second type in coincidence with transitions of a given type in the incoming signal, said circuit including locking detection means for detecting locking, said means themselves including means for sampling the output signal from the phase detector by those transitions in the outgoing signal that are of type opposite to said given type, means for storing groups of consecutive samples, comprising not less than three consecutive samples, and means for detecting the instant at which, for the first time, at least two of said samples are not at the same logic level.

* * * * *